US008558581B2

(12) United States Patent
Prohaska et al.

(10) Patent No.: US 8,558,581 B2
(45) Date of Patent: Oct. 15, 2013

(54) ANALOG RAIL-TO-RAIL COMPARATOR WITH HYSTERESIS

(75) Inventors: Armin Prohaska, Baden-Wurttemberg (DE); Holger Vogelmann, Baden-Wurttemberg (DE)

(73) Assignee: Atmel Corporation, San Jose, CA (US)

( * ) Notice: Subject to any disclaimer, the term of this patent is extended or adjusted under 35 U.S.C. 154(b) by 41 days.

(21) Appl. No.: 13/294,594

(22) Filed: Nov. 11, 2011

(65) Prior Publication Data

US 2013/0120046 A1    May 16, 2013

(51) Int. Cl.
  *H03K 5/22*    (2006.01)

(52) U.S. Cl.
  USPC .............................. 327/67; 327/206

(58) Field of Classification Search
  USPC .................. 327/65, 67, 205, 206, 63
  See application file for complete search history.

(56) References Cited

U.S. PATENT DOCUMENTS

| | | | |
|---|---|---|---|
| 6,590,436 B2 * | 7/2003 | Jordanger et al. | 327/333 |
| 7,187,223 B2 * | 3/2007 | Yeo et al. | 327/206 |
| 7,576,572 B2 * | 8/2009 | Ball | 327/65 |
| 7,902,894 B2 | 3/2011 | Mohtashemi | |
| 7,973,569 B1 * | 7/2011 | Bashar | 327/67 |
| 2002/0153943 A1 * | 10/2002 | Uchiki et al. | 327/563 |

OTHER PUBLICATIONS

Morris and Brisebois, "Rail-to-Rail Output Dual Comparator Resolves . . . ," Linear Technology Magazine, pp. 17-20 (Mar. 2002).
Baru et al., "A 2V Rail-to-Rail Micropower CMOS Comparator," Instituto de Ingenieria Electrica, Universidad de la Republica, Casilla de Correos 30, Montevideo, Uruguay, 6 pages (Printed from the internet on Nov. 10, 2011).
National Semiconductor Corporation, "LMC7211—Tiny CMOS comparator with Rail-to-Rail Input and Push-Pull Output," pp. 1-16 (Jan. 26, 2010).
Voltage Comparators, "Voltage Comparator Information and Circuts," pp. 1-18, http://home.cogeco.ca/~rpaisley4/Comparators.html (Nov. 10, 2011).
"Selecting the Right Comparator—Maxim, Tutorial 886," pp. 1-5, http://www.maxim-ic.com/app-notes/index.mvp/id/886 (Nov. 10, 2011).

* cited by examiner

*Primary Examiner* — Quan Tra
(74) *Attorney, Agent, or Firm* — Fish & Richardson P.C.

(57) ABSTRACT

According to a novel aspect, operating an analog rail-to-rail comparator circuit with common mode detection of differential input signals includes generating a hysteresis current for the comparator circuit based on a common mode voltage used for the common mode detection. The hysteresis current is added to a differential output of a comparator in the comparator circuit, such that a hysteresis voltage at an output of the comparator circuit is substantially independent of the common mode voltage.

20 Claims, 5 Drawing Sheets

ANALOG RAIL-TO-RAIL COMPARATOR WITH HYSTERESIS

FIELD OF THE DISCLOSURE

This disclosure relates to analog rail-to-rail comparators with hysteresis.

BACKGROUND

In electronic circuits, a comparator is a device that can be used to compare two voltages or currents and to provide an output indicative of the relative values of the input signals. Comparators are used in a wide range of electronic devices including, for example, microcontrollers, laptop computers, mobile telephones and other hand-held electronic devices, metering systems, RC timers, and alarm and monitoring circuits, as well other devices.

Rail-to-rail comparators allow the use of almost any input voltage within the power supply range. In such comparators, the signal peak-to-peak amplitude can be as much as (or almost as much as) the full range of the power supply. The differential input voltage (i.e., the voltage difference between two input voltages) thus is limited only by the full swing of the power supply.

A comparator normally changes its output state when the voltage between its inputs passes through approximately zero volts. Small voltage fluctuations resulting, for example, from noise, can cause undesirable rapid changes between the two output states when the input voltage difference is close to zero volts. To prevent this output oscillation, hysteresis can be integrated into the comparator.

SUMMARY

According to one novel aspect of this disclosure, operating an analog rail-to-rail comparator circuit with common mode detection of differential input signals includes generating a hysteresis current for the comparator circuit based on a common mode voltage used for the common mode detection. The hysteresis current is added to a differential output of a comparator in the comparator circuit, such that a hysteresis voltage at an output of the comparator circuit is substantially independent of the common mode voltage.

Some implementations include one or more of the following features. For example, generating the hysteresis current can include using the common mode voltage to control first and second current sources and combining a current generated by the first current source with a current generated by the second current source. In some implementations, only one of the first or second current sources is active when the common mode voltage is at or near one end of a potential range of values, only the other one of the first or second current sources is active when the common mode voltage is at or near another end of the potential range of values, and both the first and second current sources are active when the common mode voltage is in a middle region of the range of potential values. The hysteresis current can be added to a particular differential output of the comparator depending on whether the output of the comparator circuit is positive or negative.

A comparator circuit is described as well and includes a current source to generate a hysteresis current that is added to a selected differential output of a comparator such that a hysteresis voltage at an output of the circuit is substantially independent of the common mode voltage. In some implementations, the current source includes PMOS and NMOS differential stage current sources that are controlled by the common mode voltage.

Other potential aspects, features and advantages will be readily apparent from the following detailed description, the accompanying drawings, and the claims.

DETAILED DESCRIPTION

Figure 1:
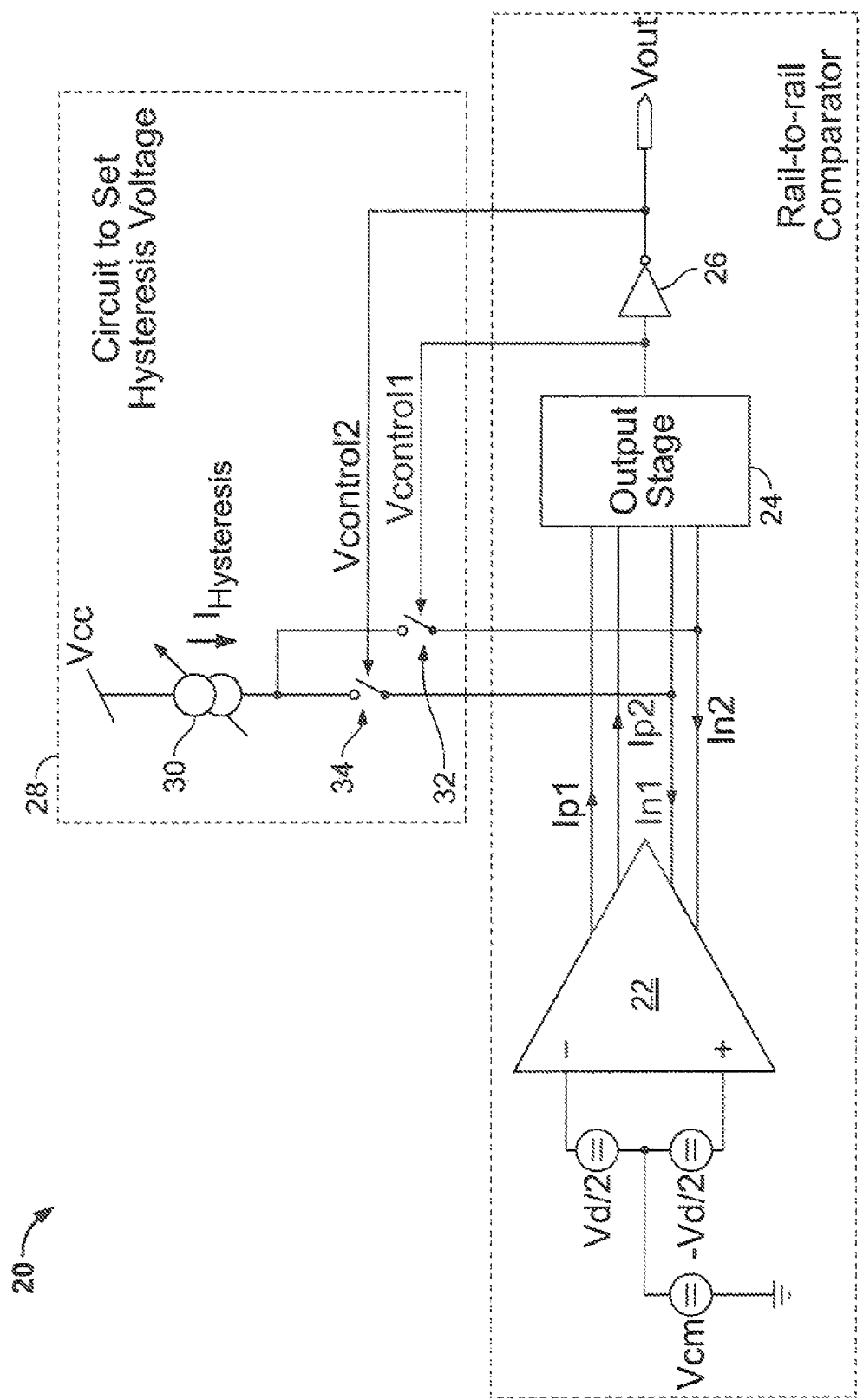
FIG. 1 is an example of a circuit diagram of a rail-to-rail comparator circuit in accordance with a novel aspect of this disclosure.

As shown in FIG. 1, an analog rail-to-rail comparator circuit 20 forms, in some implementations, part of an integrated circuit and includes a common mode voltage Vcm coupled between two differential voltage signals (Vd/2 and −Vd/2), which are provided as input to a comparator 22. In the illustrated example, the common mode voltage Vcm ranges from zero volts to about as high as the supply voltage (Vcc). The pair of differential input voltage signals can be obtained, for example, from a source external to the comparator circuit 20. For example, if the comparator 20 forms part of a microcontroller circuit, the differential voltage input signals can be received from another circuit in the microcontroller. The comparator circuit 20 provides a digital output at a pin labeled Vout. Thus, in the illustrated example, if the differential input is positive, the output at pin Vout is a digital high level or "1" signal; whereas, if the differential input is negative, the output at pin Vout is a digital low level or "0" signal.

The comparator 22 detects whether the differential voltage is positive or negative and generates four differential signals (Ip1, Ip2, In1, In2) as output. In this example, two of the output signals are positive and two are negative. In the illustrated example, if the common mode voltage Vcm is zero, then only the Ip1 and Ip2 signals will be present at the output of the comparator 22. Likewise, if the common mode voltage Vcm is equal to the supply voltage Vcc, then only the In1 and In2 signals will be present at the output of the comparator 22. If the common mode voltage falls between 0 volts and Vcc, then all four signals (Ip1, Ip2, In1, In2) will be present at the output of the comparator 22. In general, the sum of Ip1+Ip2 is constant, whereas the values of Ip1 and Ip2 vary as the difference between the input signals changes. Also, as Ip1 increases, Ip2 decreases, and vice-versa. Likewise, the sum of In1+In2 is constant, whereas the values of In1 and In2 vary as the difference between the input signals changes. As In1 increases, In2 decreases, and vice-versa. Although the differential output signals (Ip1, Ip2, In1, In2) are illustrated as differential current signals, in some implementations the differential output signals are differential voltage signals.

As shown in FIG. 1, the differential output signals from the comparator 22 are provided to output stage circuitry 24, which converts the differential current signals (Ip1, Ip2, In1, In2) to a corresponding digital voltage signal. The output stage 24 can be implemented, for example, as a folded cascode circuit. Other circuitry may be suitable for the output stage 24 in some implementations. The output signal from the output stage circuitry 24 is provided to an inverter 26, which is coupled to the output pin Vout.

Figure 2:
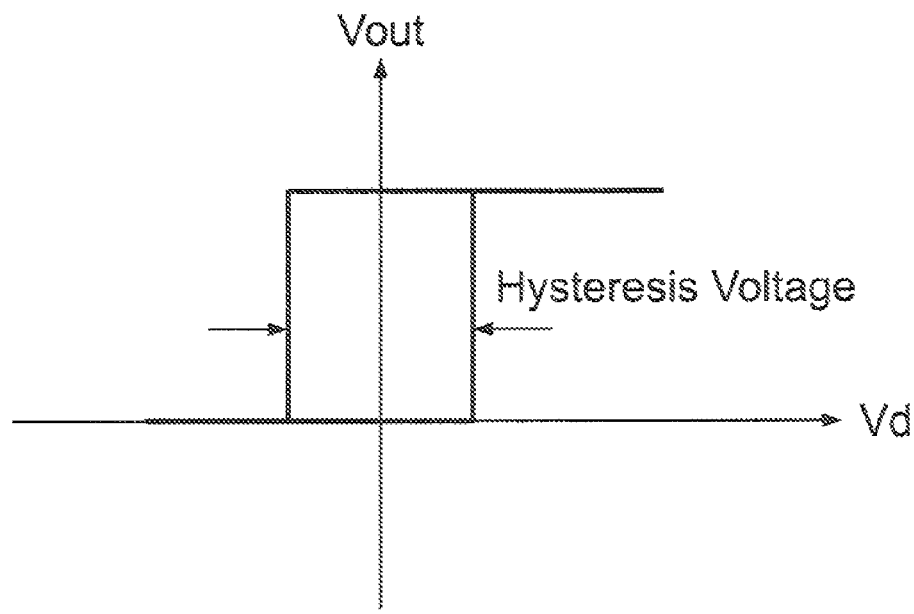
FIG. 2 is a graph to explain hysteresis voltage in the context of the present disclosure.

The comparator circuit 20 of FIG. 1 also includes circuitry 28 to set the hysteresis voltage at the output of the circuit (see FIG. 2, which illustrates the hysteresis voltage). In general, the hysteresis circuitry 28 operates such that if the input to the comparator 22 is low, the hysteresis causes operation above 0 volts, whereas if the input to the comparator 22 is high, the hysteresis causes operation below 0 volts. The circuitry 28 includes a current source 30 that can be coupled through a pair of switches 32, 34 to conductive lines, each of which carries one of the differential output signals In1 or In2. Each switch 32, 34 can be in a closed state (to allow current to flow through the switch) or an opened state (to prevent current from flowing through the switch). Each of the switches 32, 34 can be implemented, for example, as a MOS transistor.

The switches 32, 34 are controlled such that only one switch is closed at a time. In particular, as shown in FIG. 1, the voltage signal at the output stage 24 controls the first switch 32, whereas the inverted signal at the output of the inverter 26 controls the second switch 34. In FIG. 1, these control signals are identified, respectively, as Vcontrol1 and Vcontrol2. The inverted and non-inverted output voltage signals of the output stage 24 thus control the flow of current from the current source 30 so that the hysteresis current ($I_{hysteresis}$) is added either to the In1 or In2 output current of the comparator 22 depending on whether the voltage at Vout is positive or negative. For example, if the first switch 32 is closed, then the current In2 increases with respect to the current In1. Conversely, if the second switch 34 is closed, then the current In1 increases with respect to the current In2.

Figure 3:
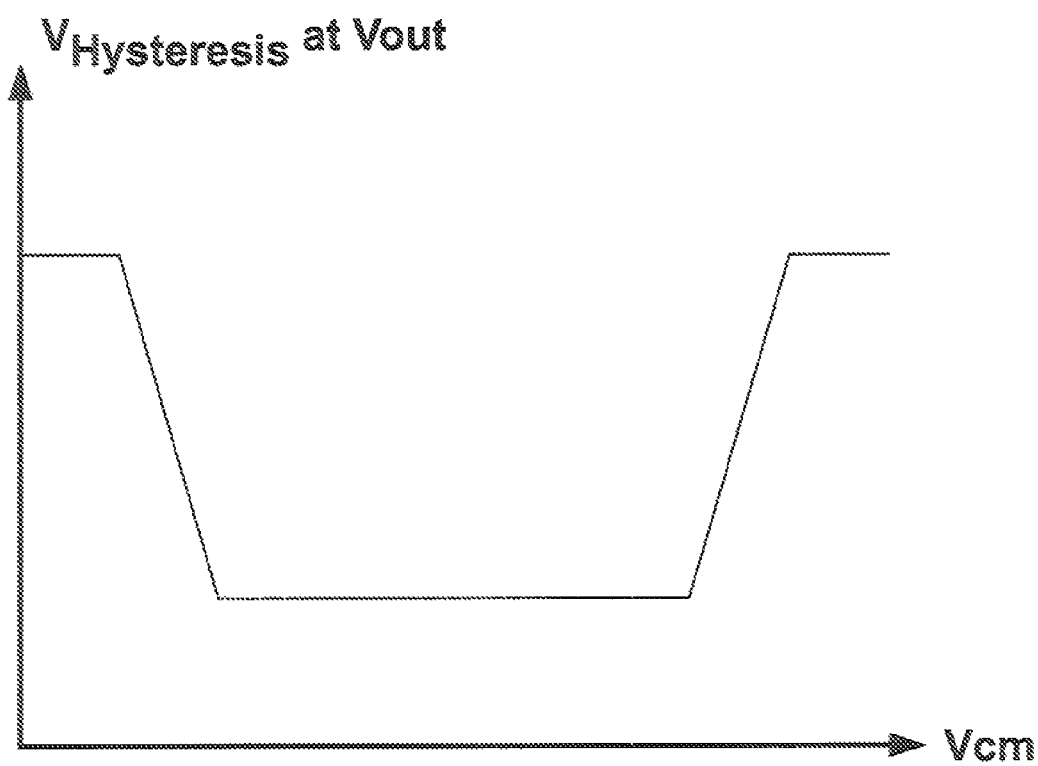
FIG. 3 is a graph illustrating an example of the hysteresis voltage having a strong dependence on a common mode voltage (Vcm).

If the hysteresis current ($I_{hysteresis}$) generated by the current source 30 were to remain constant, then the hysteresis voltage at Vout would exhibit a strong dependency on the common mode voltage Vcm (see FIG. 3). Such variations, however, generally are undesirable. To provide a more uniform and stable hysteresis voltage at Vout that is substantially independent of the common mode voltage Vcm, the current source 30 generates a hysteresis current ($I_{hysteresis}$) that is controlled by the common mode voltage Vcm. An example of circuitry for such a current source 30 is illustrated in FIG. 4 and is described in greater detail below.

Figure 4:
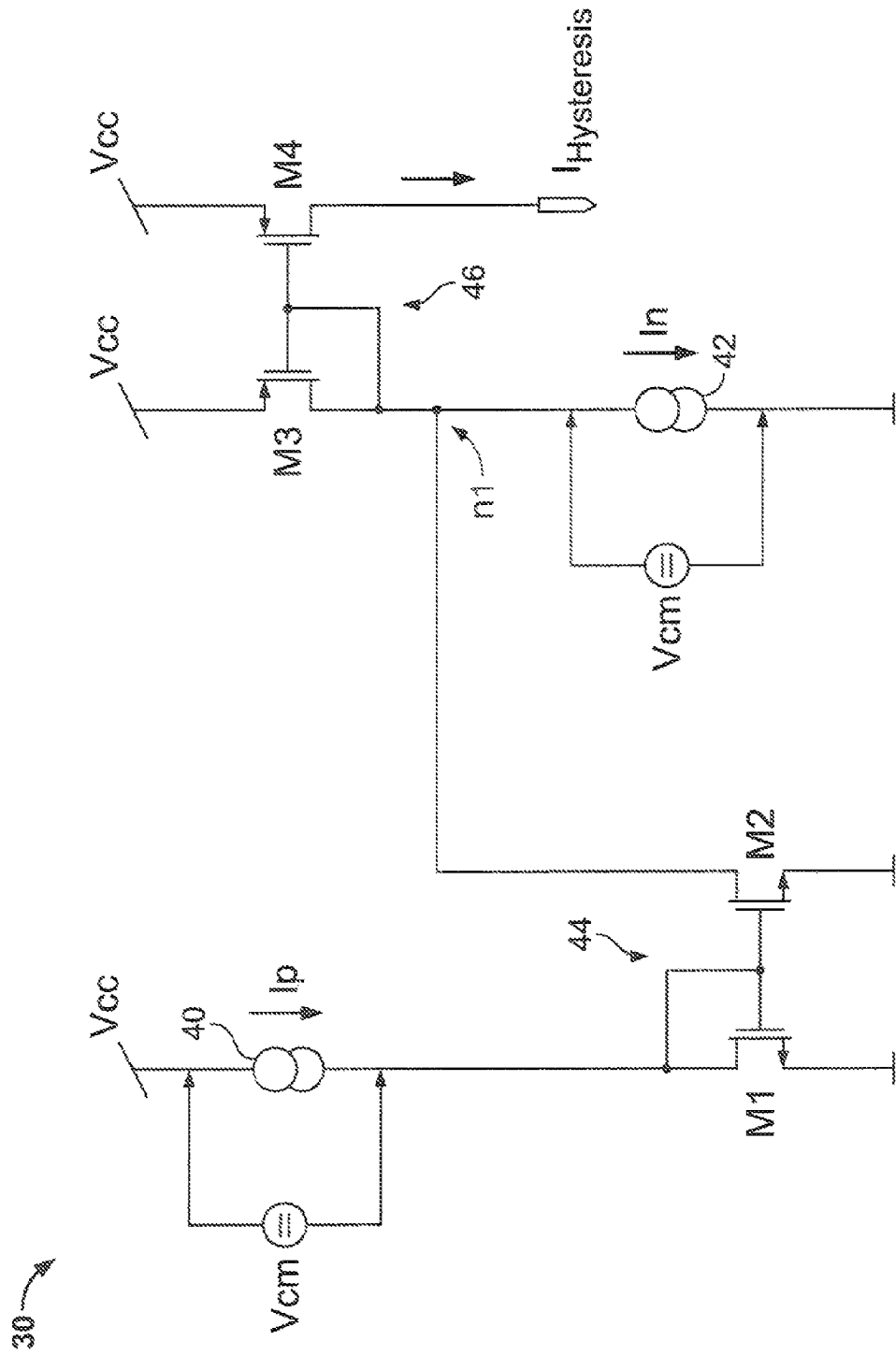
FIG. 4 is an example of a Vcm-controlled current source for use in the comparator circuit of FIG. 1.

As shown in FIG. 4, the hysteresis current ($I_{hysteresis}$) for the current source 30 can be obtained, for example, by combining the current Ip from a current source 40 and the current In from a current source 42, where the latter source 42 serves as a current sink. The current source 40 can be implemented, for example, as a Vcm-controlled PMOS differential stage current source, and the current source 42 can be implemented, for example, as a Vcm-controlled NMOS differential stage current source. In the illustrated example, current flows from the current source 40 only if the common mode voltage Vcm is equal to zero or is in the middle of the range of possible values; it does not flow if the common mode voltage is equal or close in value to Vcc. Conversely, current flows to the current source 42 only if the common mode voltage Vcm is equal to the supply voltage Vcc or is within the middle of the range of possible values; it does not flow if the common mode voltage is equal or close in value to Vcm. If the common mode voltage Vcm falls within the middle of the range of possible values, then both current sources 40, 42 are active.

Figure 5:
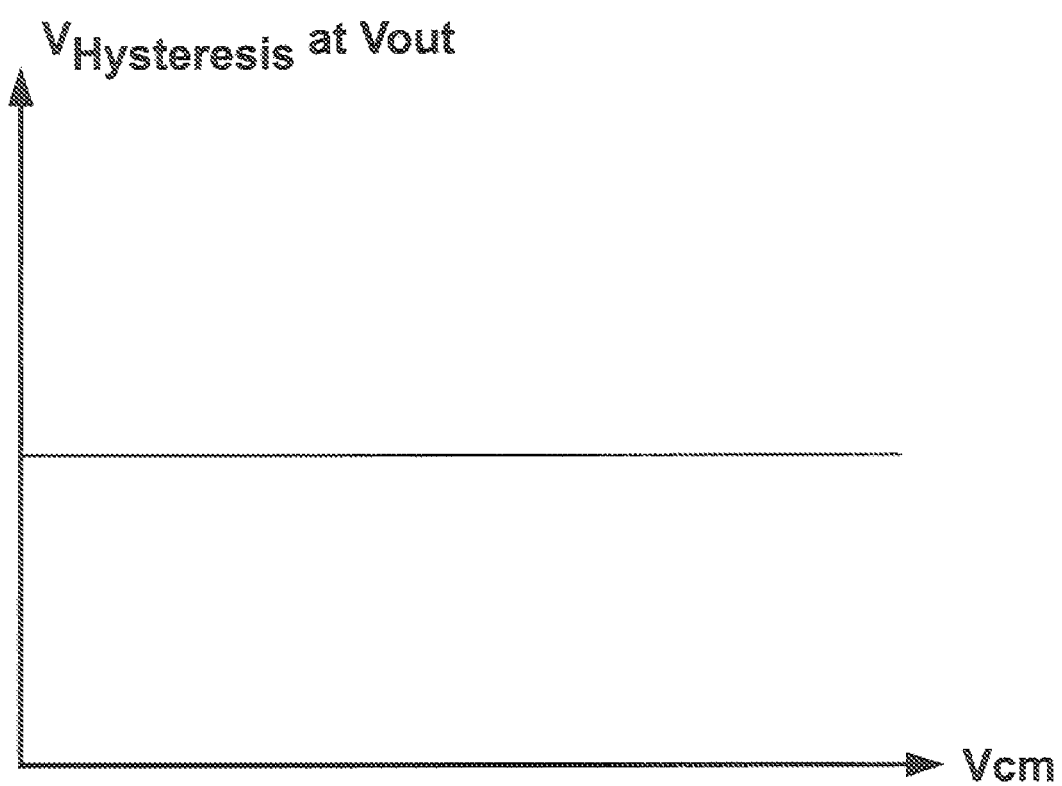
FIG. 5 is a graph illustrating a hysteresis voltage that is substantially independent of Vcm.

As further illustrated by the example of FIG. 4, the Vcm-controlled current source 40 is coupled to a current mirror 44 formed by a pair of transistors M1, M2. The current mirror 44 functions to reverse the direction of current flow so that both currents Ip and In flow in the same direction. The currents Ip and In are combined at node n1, which is coupled to a second current mirror 46 formed by a pair of transistors M3, M4, as illustrated in FIG. 4. The second current mirror 46 inverts the direction of flow of the combined current (Ip+In) so as to provide the hysteresis current ($I_{hysteresis}$). As both current sources 40, 42 are active when the common mode voltage Vcm falls in the middle of range of possible values, the net effect is to raise the hysteresis voltage ($V_{hysteresis}$) at Vout for values of Vcm that fall within the middle of the range (i.e., for values not equal or close to zero and not equal or close to Vcc). As shown in FIG. 5, raising the hysteresis voltage ($V_{hysteresis}$) at Vout for the middle of the range of values of the common mode voltage (Vcm) can result in a more uniform hysteresis voltage that is substantially independent of the common mode voltage Vcm. Thus, using the circuit of FIG. 4 for the current source 30 in FIG. 1 can result in a substantially stable hysteresis voltage that varies little, if at all, as the common mode voltage Vcm is changed. For example, assuming that Vcc=3 volts, the hysteresis voltage would remain substantially constant across different values of Vcm (e.g., Vcm=0 volts, Vcm=1.5 volts, and Vcm=3 volts).

Figure 6:
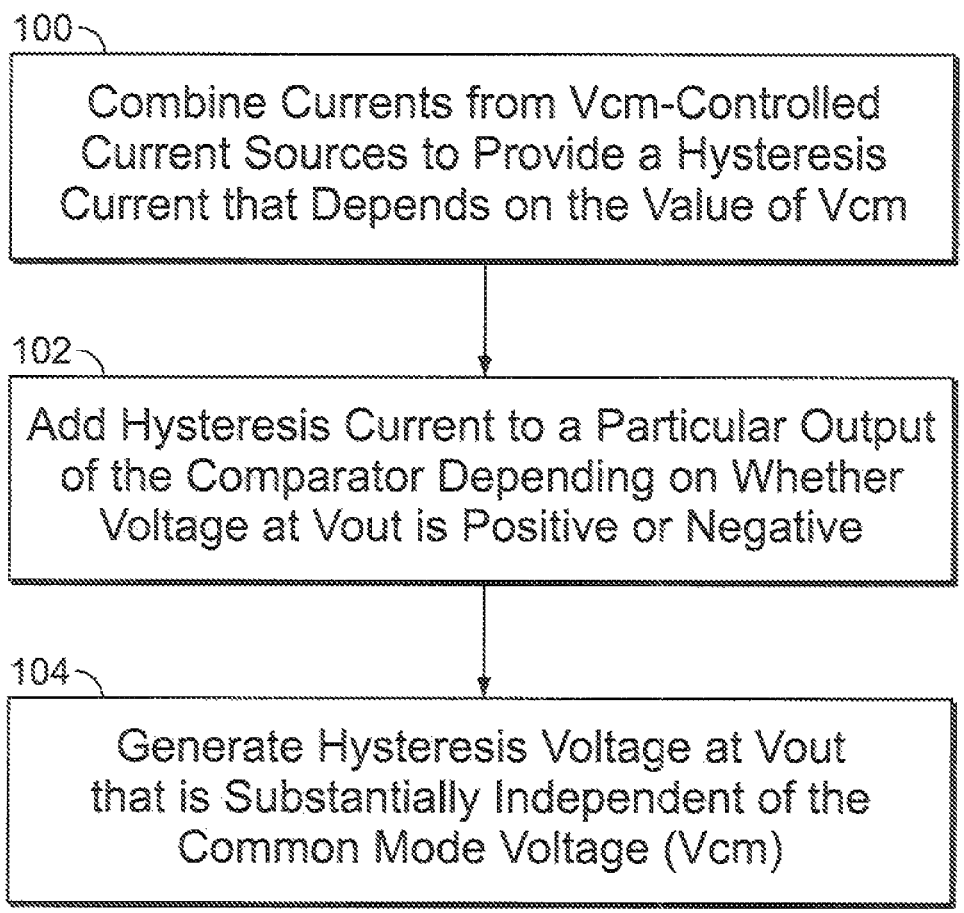
FIG. 6 is a flow chart of a method according to a novel aspect of this disclosure.

As indicated by FIG. 6, the current source 30 can be implemented by using a pair of Vcm-controlled current sources 40, 42 whose currents are combined to provide a hysteresis current ($I_{hysteresis}$=Ip+In) that depends on the value of Vcm (block 100). As explained above, the hysteresis current is added to a particular output of the comparator 22 (i.e., either In1 or In2) depending on whether the voltage at Vout is positive or negative (block 102). The Vcm-controlled current source 30 can thus be used to provide a hysteresis current for a comparator circuit 20 having common mode detection such that the hysteresis voltage at the Vout pin is substantially independent of the common mode voltage (block 104).

Although particular implementations have been described in detail, various modifications can be made within the spirit and scope of the invention. Accordingly, other implementations are within the scope of the claims.

What is claimed is:
1. A method of operating an analog rail-to-rail comparator circuit with common mode detection of differential input signals, the method comprising:
   providing, as outputs from a comparator, first, second, third and fourth differential signals when a common mode voltage used for the common mode detection is between zero volts and a supply voltage of the comparator circuit;
   generating a hysteresis current for the comparator circuit based on the common mode voltage; and
   adding the hysteresis current to a one of the differential outputs of the comparator in the comparator circuit, such that a hysteresis voltage at an output of the comparator circuit is substantially independent of the common mode voltage,
   wherein generating a hysteresis current includes:
      providing an output of a PMOS differential stage current source to a first current mirror having an output,
      providing an output of a NMOS differential stage current source to a second current mirror via a node, wherein the NMOS differential stage current source has an output,
      providing the output of the first current mirror to the node, and
      obtaining the hysteresis current from the output of the second current mirror.

2. The method of claim 1 wherein generating the hysteresis current includes using the common mode voltage to control the first and second current sources.

3. The method of claim 2 wherein generating the hysteresis current includes combining a current generated by the first current source with a current generated by the second current source.

4. The method of claim 3 wherein the second current source functions as a current sink.

5. The method of claim 3 wherein only one of the first or second current sources is active when the common mode voltage is at or near one end of a potential range of values, wherein only the other one of the first or second current sources is active when the common mode voltage is at or near another end of the potential range of values, and wherein both the first and second current sources are active when the common mode voltage is in a middle region of the range of potential values.

6. The method of claim 1 wherein the hysteresis current is added to a particular differential output of the comparator depending on whether the output of the comparator circuit is a positive value or a negative value.

7. A comparator circuit comprising:
a comparator operable to provide common mode detection of differential input signals based on a common mode voltage and to generate first, second, third and fourth differential output signals when the common mode voltage is between zero volts and a supply voltage for the comparator circuit;
output stage circuitry operable to convert the differential output signals to a corresponding digital signal;
circuitry operable to add a hysteresis current to a selected one of the differential output signals such that a hysteresis voltage at an output of the comparator circuit is substantially independent of the common mode voltage, wherein the circuitry to add the hysteresis current includes:
a PMOS differential stage current source coupled to a first current mirror having an output, and
a NMOS differential stage current source coupled at a node to a second current mirror having an output,
the output of the first current mirror being coupled to the node, and
the hysteresis current being provided from the output of the second current mirror.

8. The comparator circuit of claim 7 wherein the current sources are controlled by the common mode voltage.

9. The comparator circuit of claim 7 wherein the NMOS differential stage current source functions as a current sink.

10. The comparator circuit of claim 7 wherein a current generated by the PMOS differential stage current source is combined with a current generated by the NMOS differential stage current source to provide the hysteresis current.

11. The comparator of claim 10 wherein only one of the PMOS or NMOS differential stage current sources is active when the common mode voltage is at or near one end of a potential range of values, wherein only the other one of the PMOS or NMOS differential stage current sources is active when the common mode voltage is at or near another end of the potential range of values, and wherein both the PMOS or NMOS differential stage current sources are active when the common mode voltage is in a middle region of the potential range of values.

12. The comparator circuit of claim 11 wherein the circuitry to add a hysteresis current includes first and second switches, one of which is in a conducting state and one of which is in a non-conducting state depending on whether the output of the comparator circuit is a positive value or a negative value, wherein the hysteresis current is added to a particular differential output of the comparator depending on which one of the switches is in the conductive state.

13. The comparator circuit 12 wherein a signal from the output stage circuitry controls one of the switches and an inverted version of the signal from the output stage circuitry controls the other one of the switches.

14. The comparator circuit of claim 12 wherein each of the switches includes a respective MOS transistor.

15. The comparator circuit of claim 8 wherein the output stage circuitry includes a folded cascode circuit.

16. An integrated circuit comprising:
a comparator operable to provide common mode detection of differential input signals based on a common mode voltage and to generate first, second, third and fourth differential output signals when the common mode voltage is between zero volts and a supply voltage for the comparator circuit, wherein if the common mode voltage is equal to zero volts, then only the first and second differential output signals are provided as output of the comparator, and wherein if the common mode voltage is equal to the supply voltage then only the third and fourth differential output signals are provided as output of the comparator, the sum of the first and second differential output signals being substantially constant, and the sum of the third and fourth differential output signals being substantially constant;
output stage circuitry operable to convert the differential output signals to a corresponding digital signal;
a current source to add a hysteresis current to a selected one of the differential output signals, wherein the current source comprises:
a PMOS differential stage current source coupled between a supply voltage and a first current mirror having an output, the PMOS differential stage current source being controlled by the common mode voltage, and
an NMOS differential stage current source coupled between ground and a node that is coupled to a second current mirror having an output, the NMOS differential stage current source being controlled by the common mode voltage,
the output of the first current mirror being coupled to the node, and
the hysteresis current being provided from the output of the second current mirror.

17. The integrated circuit of claim 16 wherein only one of the first or second current sources is active when the common mode voltage is at or near one end of a potential range of values, wherein only the other one of the first or second current sources is active when the common mode voltage is at or near another end of the potential range of values, and wherein both the first and second current sources are active when the common mode voltage is in a middle region of the potential range of values.

18. The integrated circuit of claim 17 further comprising means for adding the hysteresis current to a particular differential output of the comparator depending on whether an output at the output stage circuitry is positive or negative.

19. The integrated circuit of claim 18 wherein the means for adding the hysteresis current includes first and second transistors, and wherein a signal from the output stage circuitry controls one of the transistors and an inverted version of the signal from the output stage circuitry controls the other one of the transistors.

20. The integrated circuit of claim 16 wherein a hysteresis voltage is substantially independent of the common mode voltage.

* * * * *

UNITED STATES PATENT AND TRADEMARK OFFICE
CERTIFICATE OF CORRECTION

| | | |
|---|---|---|
| PATENT NO. | : 8,558,581 B2 | Page 1 of 1 |
| APPLICATION NO. | : 13/294594 | |
| DATED | : October 15, 2013 | |
| INVENTOR(S) | : Armin Prohaska and Holger Vogelmann | |

It is certified that error appears in the above-identified patent and that said Letters Patent is hereby corrected as shown below:

Title Page, item (56), in "OTHER PUBLICATIONS", line 10:
delete: "and Circuts," and insert: --and Circuits,--.

In the Claims:

Column 5, Claim 11, Line 54:
after "comparator" insert --circuit--.

Column 6, Claim 13, Line 5:
after "circuit" insert --of claim--.

Signed and Sealed this
Twenty-fifth Day of March, 2014

Michelle K. Lee
*Deputy Director of the United States Patent and Trademark Office*